(12) United States Patent
Uramachi et al.

(10) Patent No.: US 6,789,418 B2
(45) Date of Patent: Sep. 14, 2004

(54) FLOW RATE SENSOR

(75) Inventors: Hiroyuki Uramachi, Tokyo (JP);
Masao Kikuchi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/463,542

(22) Filed: Jun. 18, 2003

(65) Prior Publication Data
US 2003/0233886 A1 Dec. 25, 2003

(30) Foreign Application Priority Data
Jun. 21, 2002 (JP) ..................................... 2002-181651

(51) Int. Cl.[7] .................................................. G01F 1/68
(52) U.S. Cl. .................................................. 73/204.22
(58) Field of Search ........................ 73/204.26, 204.25, 73/204.23, 204.22, 204.27

(56) References Cited

U.S. PATENT DOCUMENTS

| 3,782,193 | A | * | 1/1974 | Meyer et al. ................. 73/181 |
| 4,756,190 | A | * | 7/1988 | Ohta et al. ................. 73/204.15 |
| 5,396,795 | A | * | 3/1995 | Araki ........................ 73/204.26 |
| 5,723,784 | A | * | 3/1998 | Lembke et al. ........... 73/204.26 |
| 6,070,462 | A | * | 6/2000 | Igarashi et al. ........... 73/204.22 |
| 6,318,170 | B1 | * | 11/2001 | Renninger et al. ....... 73/204.26 |
| 6,357,294 | B1 | * | 3/2002 | Nakada .................... 73/204.26 |
| 6,382,023 | B1 | * | 5/2002 | Yonezawa et al. ....... 73/204.22 |

FOREIGN PATENT DOCUMENTS

JP   2000-002572 A   1/2000

* cited by examiner

*Primary Examiner*—Edward Lefkowitz
*Assistant Examiner*—Jewel V. Thompson
(74) *Attorney, Agent, or Firm*—Sughrue Mion, PLLC

(57) ABSTRACT

Projecting ends of terminal conductors projecting out of a thick portion of a holder and electrode terminals of a flow rate detecting element are electrically connected by bonding wires. A peripheral wall member is secured by an adhesive to a thin portion of the holder and the flow rate detecting element so as to surround the electrical connection portions between the projecting ends and the bonding wires and between the electrode terminals and the bonding wires. A gel is formed so as to seal the electrical connection portions, and a rubber is injected into and cured inside the peripheral wall member so as to seal the gel.

5 Claims, 8 Drawing Sheets

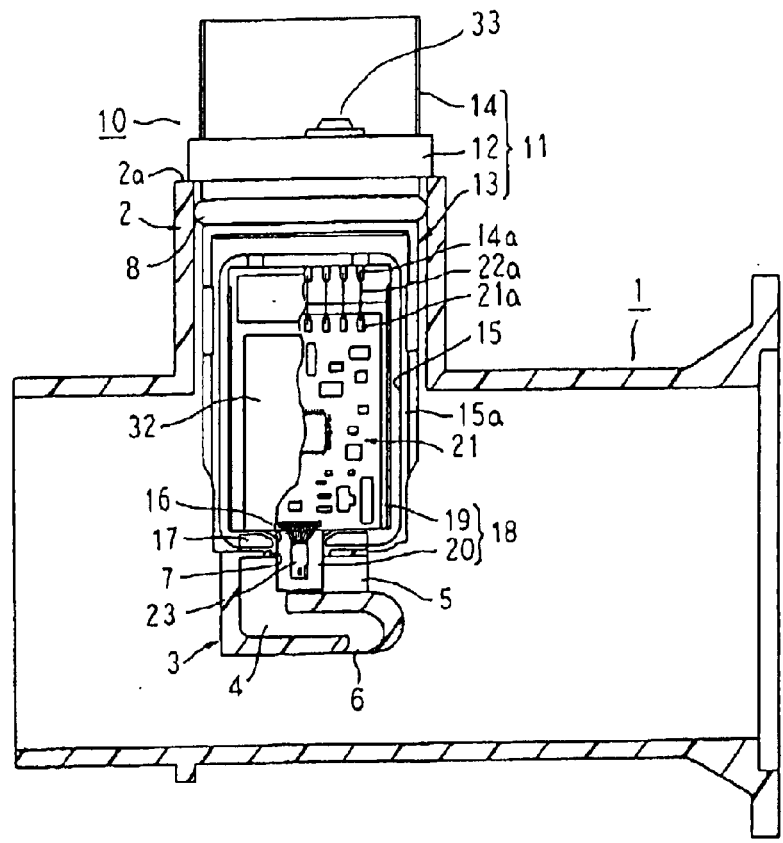
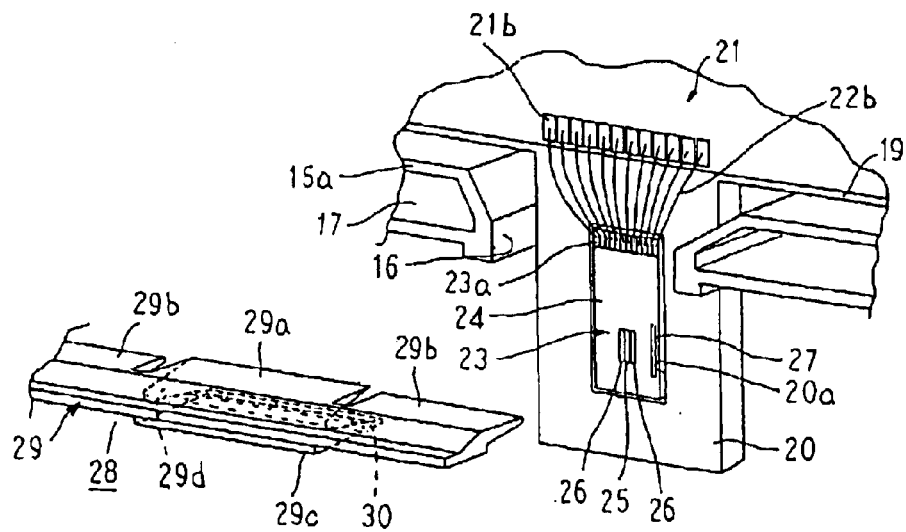

FLOW RATE SENSOR

BACKGROUND OF THE INVENTION

1. Field of the Invention

The present invention relates to a flow rate sensor for outputting a signal in response to a flow rate of a fluid being measured, and relates to a flow rate sensor suitable for measuring an intake air flow rate of an internal combustion engine in an automobile, for example.

2. Description of the Related Art

Generally, in an automotive engine, etc., an air-fuel mixture including fuel and intake air is burnt in a combustion chamber in the engine body, and rotational output from the engine is extracted from the resulting combustion pressure, requiring that the intake air flow rate be detected in order to calculate the injection rate, etc., of the fuel with high precision.

The flow rate sensor shown in Japanese Patent Laid-Open No. 2000-2572, for example, is known as a conventional technique of this kind.

FIG. 12 is a longitudinal section showing a conventional flow rate sensor such as described in Japanese Patent Laid-Open No. 2000-2572, for example, mounted to a main passage, FIG. 13 is a partial perspective showing an assembly process for the conventional flow rate sensor, and FIG. 14 is an enlarged partial cross section of the conventional flow rate sensor in FIG. 12.

In the figures, a main passage 1 is formed into a cylindrical shape from, for example, a resin material, a metal material, etc., a small-diameter cylindrical mounting aperture 2 being disposed so as to project radially outward, and a passage forming body 3 having a vertically-aligned rectangular body being disposed so as to project radially inward from an inner wall surface of the main passage 1. A bypass passage 4 is formed into a general U shape inside this passage forming body 3, an inflow aperture 5 of the bypass passage 4 opening onto the vicinity of the axial center of the main passage 1 on a front surface of the passage forming body 3, and an outflow aperture 6 of the bypass passage 4 opening onto the main passage 1 on a lower surface of the passage forming body 3. In addition, an element insertion aperture 7 is formed in the passage forming body 3 at a position opposite the mounting aperture 2.

A flow rate sensor 10 is constituted by a casing 11, a mount plate 18, a circuit board 21, a flow rate detecting element 23, etc.

The casing 11 is formed into a stepped cylindrical shape from a resin material, for example, and is constituted by: a collar-shaped mount portion 12 formed on a base end portion of the casing; a circuit accommodating portion 13 formed into a generally rectangular overall box shape and disposed so as to extend to a first side of the mount portion 12; and a connector portion 14 formed on a second side of the mount portion 12, the connector portion sending and receiving signals to and from an external portion. A circuit board mount recess portion 15 surrounded by a peripheral wall 15a forming a rectangular shape, a mount plate interfitting groove 16 formed by cutting away a portion of the peripheral wall 15a at an extremity of the casing 11, and interfitting apertures 17 formed so as to be positioned on first and second sides of the mount plate interfitting groove 16 are disposed in the circuit accommodating portion 13.

The mount plate 18 is formed into a plate-shaped body from a metal material, for example, being composed of: a circuit board mount portion 19 formed by bending edge portions of the mount plate 18 on the left and right in FIG. 12; and an element mount portion 20 formed integrally at an extremity of the circuit board mount portion 19. A rectangular element accommodating recess portion 20a for accommodating the flow rate detecting element 23 is formed in this element mount portion 20. This mount plate 18 is mounted to the casing 11 by housing the circuit board mount portion 19 inside the circuit board mount recess portion 15 such that the element mount portion 20 fits into the mount plate interfitting groove 16. Here, an extremity of the element mount portion 20 projects from the casing 11.

The circuit board 21 is disposed on the circuit board mount portion 19, electronic components for sending and receiving electric signals to and from the flow rate detecting element 23 being mounted to the circuit board 21. First circuit board terminals 21a of the circuit board 21 and connector terminals 14a of the connector portion 14 are each electrically connected by first bonding wires 22a.

The flow rate detecting element 23, as shown in FIG. 13, is provided with: a rectangular silicon substrate 24; a heater resistor 25 formed on a surface of the silicon substrate 24; a pair of resistance thermometers 26 formed on the surface of the silicon substrate 24 so as to be positioned to the left and right of the heater resistor 25; and a temperature-compensating resistor 27 formed on the surface of the silicon substrate 24, the flow rate detecting element 23 being disposed inside the element accommodating recess portion 20a. Second circuit board terminals 21b of the circuit board 21 and element terminals 23a of the flow rate detecting element 23 are each electrically connected by second bonding wires 22b.

Moreover, the heater resistor 25, the resistance thermometers 26, and the temperature-compensating resistor 27 are electrically connected to each of the element terminals 23a by a wiring pattern (not shown) formed on the surface of the silicon substrate 24. Furthermore, the electronic components mounted to the circuit board 21 constitute a heater control circuit for controlling the heater resistor 25 of the flow rate detecting element 23, an amplifying circuit for amplifying detection signals from each of the resistance thermometers 26, a reverse-current sensing circuit, etc.

A stopper member 28 is constituted by a stopper main body 29 and an elastic protrusion 30. The stopper main body 29, as shown in FIG. 13, is formed by: an elongated plate portion 29a extending flatly so as to lie across the mount plate interfitting groove 16; interfitting protrusions 29b positioned on left and right sides of the elongated plate portion 29a so as to project toward the interfitting apertures 17 of the circuit accommodating portion 13 and fit into the interfitting apertures 17; a central protrusion 29c positioned between the interfitting protrusions 29b so as to fit into the mount plate interfitting groove 16 and, as shown in FIG. 14, extend to a position in proximity to the second bonding wires 22b; and a recess portion 29d formed between the elongated plate portion 29a and the central protrusion 29c. The elastic protrusion 30 is composed of a flexible elastic material such as silicone rubber, for example, and is fixed to a leading edge portion of the central protrusion 29c. The stopper member 28 is mounted to the casing 11 such that the interfitting protrusions 29b fit into the interfitting apertures 17. Here, the elastic protrusion 30, as shown in FIG. 14, is placed in contact with a surface of the flow rate detecting element 21 in an elastically-deformed state.

A sealant 31 is formed from a silicone gel, for example, and is injected inside circuit board mount recess portion 15, as shown in FIG. 14, so as to cover the surface of the circuit board 21, the bonding wires 22a and 22b, and the connector and element terminals 14a and 23a. Thus, short-circuiting of the bonding wires 22a and 22b is prevented and the electronic components mounted to the circuit board 21 are protected.

A cover body 32 is mounted to the casing 11 such that a peripheral portion thereof is fixed by an adhesive to the peripheral wall 15a of the circuit board mount recess portion 15 and the stopper main body 29 so as to leave space between the front surface of the sealant 31 and the cover body 32. Thus, the circuit board mount recess portion 15 is sealed over, and the stopper member 28 is held with the elastic protrusion 30 placed in contact with the surface of the flow rate detecting element 21 in an elastically-deformed state.

The flow rate sensor 10 constructed in this manner is plugged into the main passage 1 by mounting an O ring 8 to the root end (the mount portion 12 end) of the circuit accommodating portion 13, inserting the circuit accommodating portion 13 so as to project inside the main passage 1 from the mounting aperture 2, and fastening the mount portion 12 to the fixing seat 2a of the mounting aperture 2 securely by a fixing screw 33. At this time, the element mount portion 20 of the flow rate sensor 10 is inserted inside the element insertion aperture 7 and the flow rate detecting element 23 is disposed inside the bypass passage 4. The flow rate sensor 10 is mounted to the main passage 1 airtightly by disposing the O ring 8 in a compressed state between the mounting aperture 2 and the circuit accommodating portion 13.

This main passage 1 is connected partway along an intake air line of the engine, an intake air filtration apparatus (not shown) being connected to a first end thereof, and an intake air manifold communicating with the inside of cylinders of the engine (not shown) being connected by means of a throttle valve, etc., (not shown) to a second end. Air cleaned by the intake air filtration apparatus flows through the inside of the main passage 1 from right to left in FIG. 12, is directed inside the bypass passage 3 through the inflow aperture 5, flows over the surface of the flow rate detecting element 23 (the silicon substrate 24), then flows out into the main passage 1 through the outflow aperture 6.

A heating current which flows through the heater resistor 25 is controlled by a circuit constructed on the circuit board 21 such that the average temperature of the heater resistor 25 is higher than the temperature of air detected by the temperature-compensating resistor 27 by a predetermined amount. Thus, the flow rate of the air is detected by making use of the cooling effect the flow of air exerts on the heater resistor 25 and changes in the resistance values of each of the resistance thermometers 26.

If the conventional flow rate sensor 10 constructed in this manner is used as an intake air flow rate detecting apparatus in an internal combustion engine, for example, it is normally plugged in immediately downstream from the intake air filtration device. This intake air filtration apparatus is normally fastened to a vehicle body or chassis inside an engine compartment. Thus, vibrational acceleration has been comparatively small since vibrations to which the flow rate sensor 10 is subjected are transmitted through the vehicle body or the chassis.

However, in recent years, with demand for reductions in the size of engine compartments, intake air filtration apparatuses are increasingly being installed immediately above the engine and fastened to the engine. The flow rate sensor 10 may also be fastened to a throttle body and then the throttle body is fastened directly onto the engine. In such cases, since the vibrational acceleration induced by operation of the engine is transferred to the flow rate sensor 10 directly through the intake air filtration apparatus, vibrational acceleration occurring in the flow rate sensor 10 is extremely large compared to cases where the intake air filtration apparatus to which the flow rate sensor 10 is fastened is fastened to the vehicle body or the chassis.

Because the conventional flow rate sensor 10 is securely fastened to the fixing seat 2a of the main passage 1 by the fixing screw 33, when the flow rate sensor 10 is subjected to vibration, the vibrational mode is one of cantilever support in which the fixing seat 2a and the O ring 8 constitute a fixed end and the element mount portion 20 constitutes a free end. Thus, vibrational acceleration occurring in the circuit board 21, the bonding wires 22b, and the sealant 31 is larger than vibrational acceleration occurring at the fixing seat 2a.

At the same time, a soft silicone gel, etc., is normally used for the sealant 31 in order to improve heat shock tolerance. The volume of silicone gel (sealant 31) is large in order to seal the entire front surface of the circuit board 21. In other words, a large volume of silicone gel (sealant 31) is formed into a single elastic body. Because the cover body 32 is mounted to the front surface of the silicone gel (the sealant 31) so as to leave space, there is no structure mechanically restraining the silicone gel (the sealant 31). Consequently, if the sealant 31 is viewed as a single elastic body, the characteristic frequency of the sealant 31 is extremely low compared with the characteristic frequency of the casing 11 in which the circuit board 21 and the mount plate 18 are installed. Because of this, the circuit board 21 tries to vibrate in a vibrational mode similar to the vibration to which the flow rate sensor 10 is subjected, but portions excluding an electrical connection portion 34 between the terminals 21b and 23a of the bonding wires 22b try to vibrate together with the sealant 31 in a vibrational mode differing from that of the circuit board 21. Thus, stress corresponding to displacement due to the differences in the vibrational modes arises in concentration at the interface between the sealant 31 and the circuit board 21, in other words, at the electrical connection portion 34.

Thus, when stress equal to or greater than the bond strength of the electrical connection portion 34 of the bonding wires 22b disposed inside the sealant 31 arises, separation from the electrical connection portion 34 or breakage of the bonding wires 22b arises, bringing about abnormalities in the output from the flow rate sensor 10, thereby giving rise to problems.

One countermeasure that may be considered in order to solve problems of this kind is to change the material of the sealant 31 to an epoxy resin, for example, to increase the overall rigidity and hardness of the sealant 31. In that case, problems such as those described above can be solved because the circuit board 21, the bonding wires 22b, and the sealant 31 vibrate together. However, if the environment in which the flow rate sensor 10 is mounted is such that the flow rate sensor 10 is exposed to "thermal shock", for example, in which high ambient temperatures and low ambient temperatures repeatedly alternate, because the highly-rigid epoxy resin is in close contact with the electrical connection portion 34, the epoxy resin and the bonding wires 22b are simultaneously subjected to repeated thermal expansion and thermal contraction due to the heat drop of the thermal shock. In such cases, a great deal of thermal stress resulting from the high rigidity of the epoxy resin is generated repeatedly in the electrical connection portion 34 due to differences in coefficients of thermal expansion between the epoxy resin and the bonding wires 22b. Thus, when thermal stress equal to or greater than the bond strength of the electrical connection portion 34 arises, separation from the electrical connection portion 34 or breakage of the bonding wires 22b arises. In addition, when thermal stress arises repeatedly in the electrical connection portion 34 and exceeds the fatigue limit of the bonding wires 22b, breakage of the bonding wires 22b occurs.

SUMMARY OF THE INVENTION

The present invention aims to solve the above problems and an object of the present invention is to provide a flow rate sensor having superior durability in which the occurrence of output anomalies is suppressed by reducing stress occurring at an electrical connection portion as a result of vibration or thermal shock to avoid wire breakage in the electrical connection portion.

With the above object in view, according to a first aspect of the present invention, there is provided a flow rate sensor including a stanchion portion in which terminal conductors are embedded; a flow rate detecting element for detecting a flow rate of a fluid being measured, the flow rate detecting element being disposed at a first end of the stanchion portion; connecting conductors for electrically connecting electrode terminals of the flow rate detecting element and end portions of the terminal conductors exposed from the stanchion portion, respectively; and an electronic circuit portion for controlling an electric current flowing to the flow rate detecting element, the electronic circuit portion being electrically connected to the flow rate detecting element by means of the terminal conductors and the connecting conductors. The flow rate sensor has a plug-in construction in which the first end of the stanchion portion is inserted into an aperture opening onto a main passage through which the fluid being measured flows so as to extend into the main passage to detect the flow rate of the fluid being measured. Electrical connection portions between the electrode terminals of the flow rate detecting element and the connecting conductors and between the end portions of the terminal conductors and the connecting conductors are sealed by a first sealant, and the first sealant is sealed by a second sealant, the second sealant having a physical property of higher hardness than the first sealant.

Therefore, the occurrence of output anomalies is suppressed by reducing stress occurring at the electrical connection portion as a result of vibration or thermal shock to avoid separation of the electrical connection portions or wire breakage in the connecting conductors, thereby providing the flow rate sensor having superior durability.

According to a second aspect of the present invention, there is provided a flow rate sensor including a stanchion portion in which terminal conductors are embedded; a flow rate detecting element for detecting a flow rate of a fluid being measured, the flow rate detecting element being disposed at a first end of the stanchion portion; connecting conductors for electrically connecting electrode terminals of the flow rate detecting element and end portions of the terminal conductors exposed from the stanchion portion, respectively; and an electronic circuit portion for controlling an electric current flowing to the flow rate detecting element, the electronic circuit portion being electrically connected to the flow rate detecting element by means of the terminal conductors and the connecting conductors. The flow rate sensor has a plug-in construction in which the first end of the stanchion portion is inserted into an aperture opening onto a main passage through which the fluid being measured flows so as to extend into the main passage to detect the flow rate of the fluid being measured. A covering member is airtightly mounted to the stanchion portion and the flow rate detecting element so as to envelop the electrode terminals of the flow rate detecting element, the end portions of the terminal conductors, and the connecting conductors, a portion of said flow rate sensor enveloped by the covering member constituting a hollow cavity.

Therefore, the occurrence of output anomalies is suppressed by reducing stress occurring at the electrical connection portions as a result of vibration or thermal shock to avoid wire breakage at the electrical connection portions, thereby providing a flow rate sensor having superior durability.

BRIEF DESCRIPTION OF THE DRAWINGS

FIG. 12 is a longitudinal section showing a conventional flow rate sensor mounted to a main passage;

FIG. 13 is a partial perspective showing an assembly process for the conventional flow rate sensor.

DETAILED DESCRIPTION OF THE PREFERRED EMBODIMENTS

Preferred embodiments of the present invention will now be explained with reference to the drawings.

Embodiment 1

Figure 1:
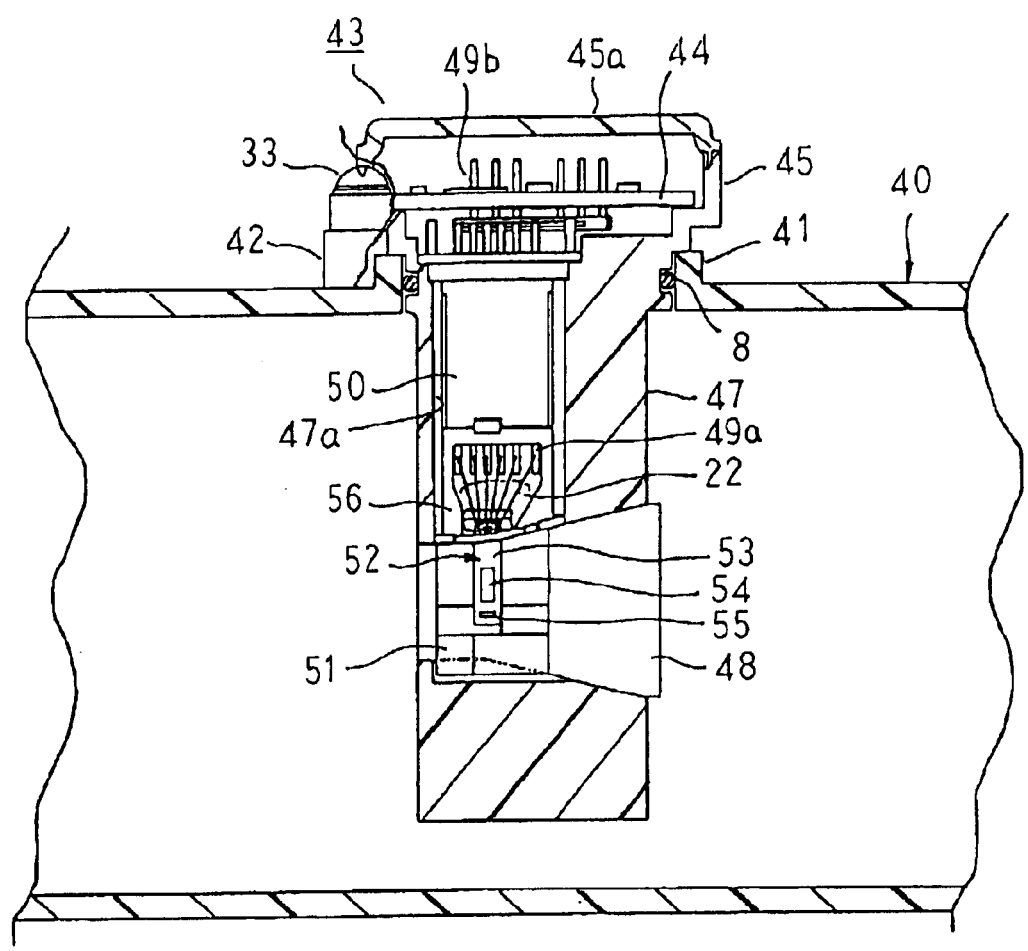
FIG. 1 is a longitudinal section showing a flow rate sensor according to Embodiment 1 of the present invention installed in a main passage.
Figure 2:
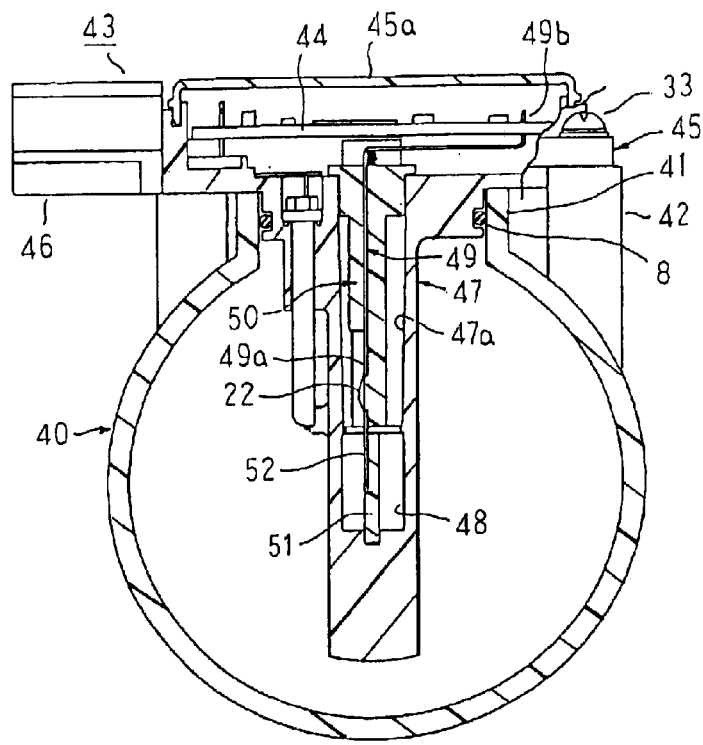
FIG. 2 is a cross section showing the flow rate sensor according to Embodiment 1 of the present invention installed in the main passage.
Figure 3:
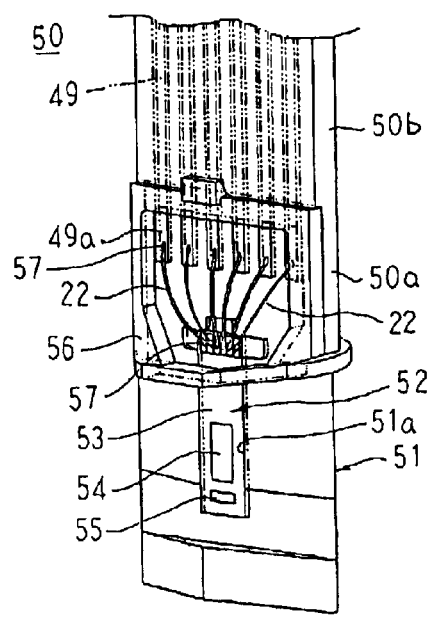
FIG. 3 is an enlarged partial perspective showing an electrical connection portion of a flow rate detecting element in the flow rate sensor according to Embodiment 1 of the present invention in an unsealed state.
Figure 4:
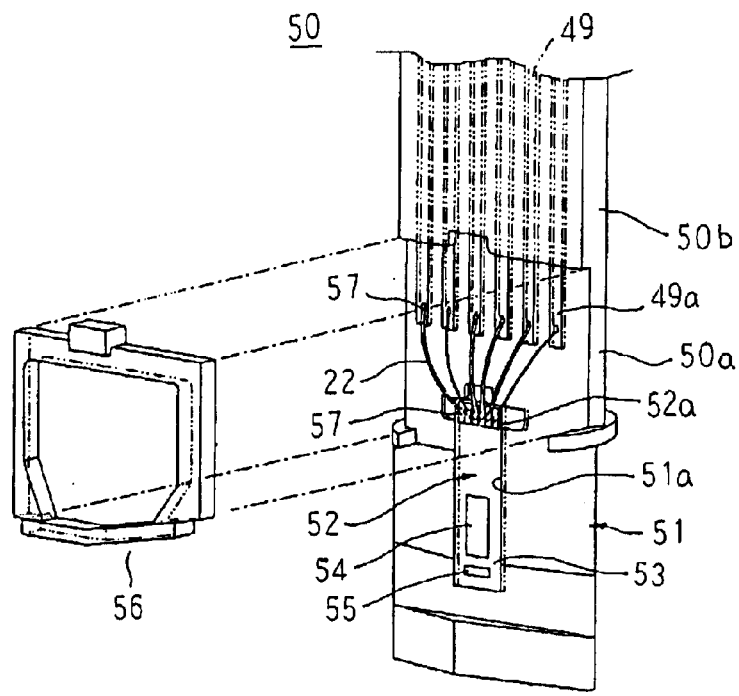
FIG. 4 is an enlarged partial perspective explaining a method for mounting a peripheral wall member to the electrical connection portion of the flow rate detecting element in the flow rate sensor according to Embodiment 1 of the present invention.
Figure 5:
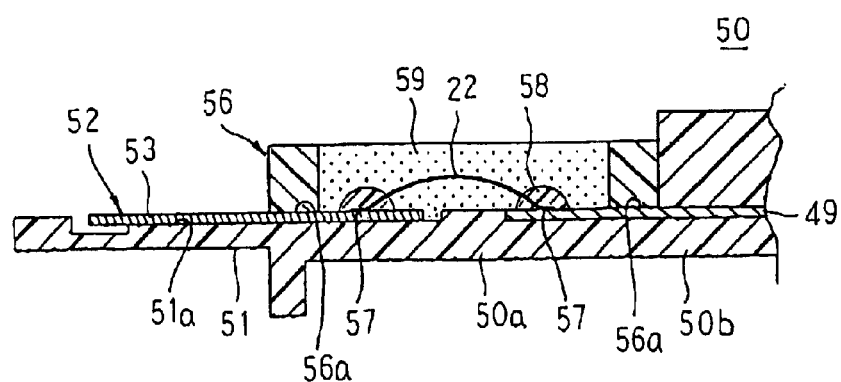
FIG. 5 is a partial cross section showing a vicinity of the electrical connection portion of the flow rate detecting element in the flow rate sensor according to Embodiment 1 of the present invention.

FIGS. 1 and 2 are a longitudinal section and a cross section, respectively, showing a flow rate sensor according to Embodiment 1 of the present invention installed in a main passage, FIG. 3 is an enlarged partial perspective showing an electrical connection portion of a flow rate detecting element in the flow rate sensor according to Embodiment 1 of the present invention in an unsealed state, FIG. 4 is an enlarged partial perspective explaining a method for mounting a peripheral wall member to the electrical connection portion of the flow rate detecting element in the flow rate sensor according to Embodiment 1 of the present invention, and FIG. 5 is a partial cross section showing the vicinity of the electrical connection portion of the flow rate detecting element in the flow rate sensor according to Embodiment 1 of the present invention.

In the figures, a main passage 40 is a cylindrical pipe body through which a fluid being measured flows, a mounting aperture 41 being formed into a portion of a peripheral wall of the main passage 40 and a boss 42 being disposed so as to protrude from the peripheral wall in the vicinity of the mounting aperture 41. Moreover, in the case of an automotive internal combustion engine, this main passage 40 is prepared integrally with an intake air filtration apparatus (not shown) using a resin, for example, and is connected partway along an intake air line of the engine, the intake air filtration apparatus being disposed on an air intake side, and an intake air manifold communicating with the inside of cylinders of the engine (not shown) being connected by means of a throttle valve, etc., (not shown) to a second end of the main passage 40. In that case, the fluid being measured is air.

A flow rate sensor 43 includes: a circuit board 44 functioning as an electronic circuit portion to which electronic components are mounted so as to constitute a circuit for controlling a flow rate detecting element 52 described below; a circuit case 45 for accommodating the circuit board 44 in an interior portion, a cover 45a fitting onto the circuit case 45; a connector 46 formed integrally with the circuit case 45 for supplying electric power to the flow rate sensor 43 and extracting a flow rate detection signal from the flow rate sensor 43 to an external portion; a columnar member 47 projecting to a first side from the circuit case 45, a detector passage 48 through which a fluid being measured flows being formed in the columnar member 47; a holder 50 in which metal terminal conductors 49 are insert molded, disposed inside the columnar member 47; a flat detector auxiliary portion 51 formed integrally in a first end of the holder 50; a flow rate detecting element 52 mounted to this detector auxiliary portion 51; a peripheral wall member 56 mounted to the holder 50 so as to surround electrical connection portions 57 connecting the terminal conductors 49 and the flow rate detecting element 52; a gel 58 functioning as a first sealant for sealing the electrical connection portions 57; and a rubber 59 functioning as a second sealant injected inside the peripheral wall member 56 so as to seal the gel 58.

The circuit case 45, the connector 46, and the columnar member 47 are formed integrally using a resin such as a polybutylene terephthalate, for example. A holder accommodating aperture 47a for accommodating the holder 50 is formed in the columnar member 47 so as to communicate between the circuit case 45 and the detector passage 48.

The holder 50, which functions as a stanchion portion, is formed into a flat, elongated, stepped shape having a thin portion 50a at a first end using a resin such as a polybutylene terephthalate, for example, first ends of the insert-molded terminal conductors 49 projecting onto the thin portion 50a from a thick portion 50b such that surfaces of the terminal conductors 49 are positioned in a common plane with a major surface of the thin portion 50a. The flat detector auxiliary portion 51 is disposed so as to extend from the first end of the thin portion 50a of the holder 50 so as to be positioned in a common plane with the major surface of the thin portion 50a. A rectangular element accommodating recess portion 51a for accommodating the flow rate detecting element 52 is formed in a major surface of the detector auxiliary portion 51.

The flow rate detecting element 52 is provided with: a rectangular silicon substrate 53; and a flow rate detection resistor 54 and a temperature-compensating resistor 55 formed by patterning a platinum film coated onto a major surface of the silicon substrate 53, the flow rate detecting element 52 being accommodated inside the element accommodating recess portion 51a so as to be positioned in a common plane with the major surface of the detector auxiliary portion 51, a rear surface of the flow rate detecting element 52 being secured by an adhesive to a bottom surface of the element accommodating recess portion 51a. Electrode terminals 52a of the flow rate detecting element 52 and projecting ends 49a of the terminal conductors 49 projecting from the thick portion 50b are each electrically connected by bonding wires 22 each functioning as a connecting conductor.

The peripheral wall member 56 is formed into a substantially rectangular frame shape using a resin such as a polybutylene terephthalate, for example, a bottom surface 56a thereof being formed into a flat surface constituting a bonding surface. This peripheral wall member 56 is placed on the holder 50 so as to surround the electrical connection portions 57 between each of the electrode terminals 52a and the bonding wires 22 and between the projecting ends 49a of the terminal conductors 49 and the bonding wires 22, the bottom surface 56a of the peripheral wall member 56 being secured by an adhesive to the major surfaces of the thin portion 50a constituting a portion of the holder 50 and the detector auxiliary portion 51 and the major surface of the flow rate detecting element 52. The gel 58, which has a fluorine resin component, is applied and cured so as to embed the electrical connection portions 57 and in addition the rubber 59, which has a fluorine resin component, is injected and cured inside the peripheral wall member 56 so as to embed the gel 58 as shown in FIG. 5. Moreover, the hardness and rigidity of the fluorine resin constituting the rubber 59 is higher than that of the fluorine resin constituting the gel 58.

The holder 50 with the flow rate detecting element 52 mounted in this manner is mounted to the columnar member 47 so as to be accommodated inside the holder accommodating aperture 47a such that the detector auxiliary portion 51 at the first end of the holder 50 projects into the detector passage 48. Here, the detector auxiliary portion 51 passes through a central axis of the detector passage 48 (aligned with the direction of flow of the fluid being measured in a direction perpendicular to the surface of the page in FIG. 2), being disposed so as to divide the passage cross section of the detector passage 48 perpendicular to the central axis substantially into two sections. The major surface of the detector auxiliary portion 51, in other words, the major surface of the flow rate detecting element 52, is substantially parallel to the central axis of the detector passage 48, the flow rate detection resistor 54 being positioned at the position of the central axis of the detector passage 48.

Second ends 49b of the terminal conductors 49 projecting into the circuit case 45 from the holder 50 are electrically connected to the circuit board 44. The electronic components mounted to the circuit board 44 constitute a control circuit for controlling an electric current flowing to the flow rate detection resistor 54, etc.

The flow rate sensor 43 constructed in this manner is plugged into the main passage 40 by mounting an O ring 8 to the root end (the circuit case 45 end) of the columnar member 47, inserting the columnar member 47 so as to project inside the main passage 40 from the mounting aperture 41, and fastening the circuit case 45 to the boss 42 securely by a fixing screw 33. The flow rate sensor 43 is mounted to the main passage 4 airtightly by disposing the O ring 8 in a compressed state between the mounting aperture 41 and the columnar member 47. The central axis of the detector passage 48 is substantially aligned with the central axis of the main passage 40.

The fluid being measured flowing through the inside of the main passage 40 is directed inside the detector passage 48 and flows over the surface of the flow rate detecting element 52. The electric current flowing to the flow rate detection resistor 54 is controlled by the control circuit mounted to the circuit board 44 such that the average temperature of the flow rate detection resistor 54 is a predetermined amount higher than the temperature of the fluid being measured as detected by the temperature-compensating resistor 55. The flow rate of the fluid being measured flowing through the inside of the main passage 40 is detected by extracting this electric current as a detected flow rate signal.

According to Embodiment 1, the electrical connection portions 57 between the electrode terminals 52a of the flow rate detecting element 52 and the bonding wires 22 and between the projecting ends 49a of the terminal conductors 49 and the bonding wires 22 are sealed by the gel 58. Thus, condensation on the electrical connection portions 57 is prevented by the gel 58, suppressing the occurrence of output anomalies from the flow rate sensor 43 resulting from short-circuiting between the electrical connection portions 57.

Furthermore, the electrical connection portions 57 do not come into with the sealant, in which the hardness and rigidity are comparatively high, or more specifically, they contact the gel 58, in which the hardness and rigidity are low. Thus, in cases where the flow rate sensor 43 is used as an intake air flow rate detecting apparatus in an internal combustion engine, even if thermal shock heat drop occurs due to repeatedly alternating high ambient temperatures and low ambient temperatures, thermal stress arising due to the differences in coefficients of thermal expansion between the sealant and the electrical connection portions 57 is kept to a minimum since it results from the low rigidity of the gel 58, in other words, since the thermal stress is absorbed and moderated by the gel 58. Thus, the occurrence of thermal stress equal to or greater than the bond strength of the electrical connection portions 57 is suppressed, preventing separation from the electrical connection portions 34 or breakage of the bonding wires 22. The occurrence of breakage of the bonding wires 22 resulting from thermal stress occurring repeatedly at the electrical connection portions 57 is also suppressed.

Because the rubber 59, which has higher hardness and rigidity than the gel 58, is injected into an upper layer above the gel 58 and the interior portion of the peripheral wall member 56, when a great deal of vibration is applied to the flow rate sensor 43, the rubber 59, the peripheral wall member 56, and the bonding wires 22 vibrate together. Thus, the rubber 59 will not vibrate at a vibrational mode that is different from that of the electrical connection portions 57, the flow rate detecting element 52, and the holder 50. Consequently, stress concentrated at the electrical connection portions 57 due to differences in the vibrational mode between the rubber 59 enveloping the bonding wires 22 and the electrical connection portions 57, the flow rate detecting element 52, and the holder 50 is eliminated, suppressing separation from the electrical connection portions 57 and breakage of the bonding wires 22, thereby enabling output anomalies from the flow rate sensor 43 to be prevented.

Moreover, in Embodiment 1 above, a gel 58 composed of the fluorine resin is used for the first sealant sealing the electrical connection portions 57, but it is only necessary for the first sealant to be a sealant having gel-like physical properties, and for example, a silicone-resin sealant can be used.

In Embodiment 1 above, a rubber 59 composed of a fluorine resin is used for the second sealant to fill the peripheral wall member 56 so as to embed the first sealant, but it is only necessary for the second sealant to have hardness and rigidity higher than the first sealant, and for example, an elastomer such as a silicone resin, etc., a resin molding material or a polycarbonate such as an epoxy resin, a polyphenylene sulfide (PPS), etc., or a plastomer such as an engineering plastic material, etc., such as a polyimide, etc., can be used.

In Embodiment 1 above, the holder 50 functions as a stanchion portion for disposing the flow rate detecting element 52 in a predetermined position inside the main passage 40, but the whole of the columnar member 47 mounted with the holder 50 may also function as the stanchion portion.

In Embodiment 1 above, the circuit board 44 is installed inside a circuit case 45 and is electrically connected to a flow rate detecting element 52 by bonding wires 22 through terminal conductors 49 enveloped by a columnar member 47, but the circuit board 44 may also be enveloped by the columnar member 47, electrode terminals 52a of the flow rate detecting element 52 and electrode terminals of the circuit board 44 being electrically connected by the bonding wires 22 directly. In that case, the gel 58 and the rubber 59 will be formed so as to seal the bonding wires 22, the electrical connection portions between the bonding wires 22 and the flow rate detecting element 52 and between the bonding wires 22 and the circuit board 44, and also the front surface of the circuit board 44. Then, the electrode terminals of the circuit board 44 each function as a terminal conductor.

Embodiment 2

Figure 6:
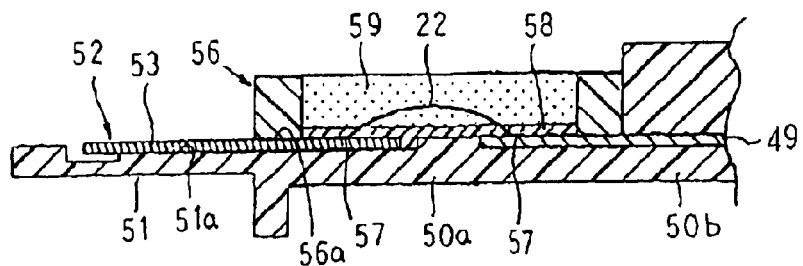
FIG. 6 is a partial cross section showing a vicinity of an electrical connection portion of a flow rate detecting element in a flow rate sensor according to Embodiment 2 of the present invention.

In Embodiment 2, as shown in FIG. 6, the gel 58 having the fluorine resin component functioning as the first sealant is injected into and cured inside the peripheral wall member 56 at a uniform thickness so as to embed the electrical connection portions 57, and the rubber 59 having the fluorine resin component functioning as the second sealant is injected into and cured inside the peripheral wall member 56 on top of the gel 58 at a uniform thickness so as to embed the bonding wires 22 exposed through the gel 58.

Moreover, the rest of this embodiment is constructed in a similar manner to Embodiment 1 above.

Because the electrical connection portions 57 are sealed by the gel 58 and the electrical connection portions 57 come into contact with the gel 58, in which hardness and rigidity are low, and the rubber 59, which has higher hardness and rigidity than the gel 58, is injected into an upper layer above the gel 58 and an interior portion of the peripheral wall member 56, similar effects to those in Embodiment 1 above can also be achieved in Embodiment 2.

In Embodiment 1 above, because the gel 58 is applied insularly so as to embed the electrical connection portions 57, it is necessary to control the applied quantity and the position of application of the gel 58. However, in Embodiment 2, it is sufficient to inject the gel 58 into the peripheral wall member 56 so as to embed the electrical connection portion 57 without having to control the applied quantity and the position of application of the gel 58 as in Embodiment 1 above, thereby making Embodiment 2 superior in mass producibility.

Embodiment 3

Figure 7:
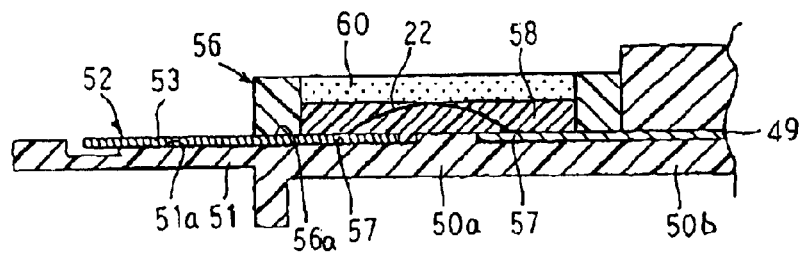
FIG. 7 is a partial cross section showing a vicinity of an electrical connection portion of a flow rate detecting element in a flow rate sensor according to Embodiment 3 of the present invention.

In Embodiment 3, as shown in FIG. 7, the gel 58 having the fluorine resin component functioning as the first sealant is injected into and cured inside the peripheral wall member 56 at a uniform thickness so as to embed the whole of the bonding wires 22 including the electrical connection portions 57, and an epoxy resin is injected into and cured inside the peripheral wall member 56 to form an epoxy resin layer 60 functioning as the second sealant to a uniform thickness above the gel 58.

Moreover, the rest of this embodiment is constructed in a similar manner to Embodiment 1 above.

Because the bonding wires 22 including the electrical connection portions 57 are sealed by the gel 58 and the electrical connection portions 57 come into contact with the gel 58, in which hardness and rigidity are low, and the epoxy resin layer 60, which has higher hardness and rigidity than the gel 58, is injected into and cured in an upper layer above the gel 58 and an interior portion of the peripheral wall member 56, similar effects to those in Embodiment 1 above can also be achieved in Embodiment 3.

In Embodiment 3, it is sufficient to inject the gel 58 into the peripheral wall member 56 so as to embed the whole of the bonding wires 22 without having to control the applied quantity and the position of application of the gel 58 as in Embodiment 1 above, thereby making Embodiment 3 superior in mass producibility.

Because an epoxy resin layer 60 constituting a plastomer is used for the second sealant instead of the rubber 59, the hardness and rigidity of the second sealant is significantly increased compared to Embodiment 1 above. Thus, when a great deal of vibration is applied to the flow rate sensor, the epoxy resin layer 60, the peripheral wall member 56, and the bonding wires 22 vibrate together reliably and the epoxy resin layer 60 will not vibrate at a vibrational mode that is different from that of the electrical connection portions 57, the flow rate detecting element 52, and the holder 50.

Moreover, in Embodiment 3 above, an epoxy resin is used for the second sealant, but the second sealant is not limited to an epoxy resin and, for example, a resin molding material or a polycarbonate such as a polyphenylene sulfide (PPS), etc., or a plastomer such as an engineering plastic material, etc., such as a polyimide, etc., can be used.

Embodiment 4

Figure 8:
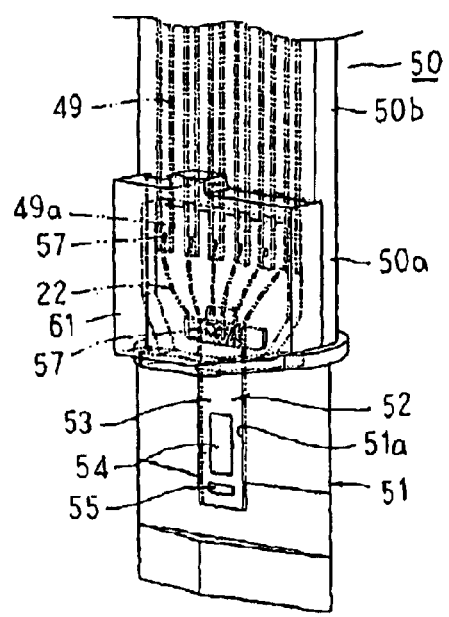
FIG. 8 is an enlarged partial perspective showing an electrical connection portion of a flow rate detecting element in a flow rate sensor according to Embodiment 4 of the present invention.
Figure 9:
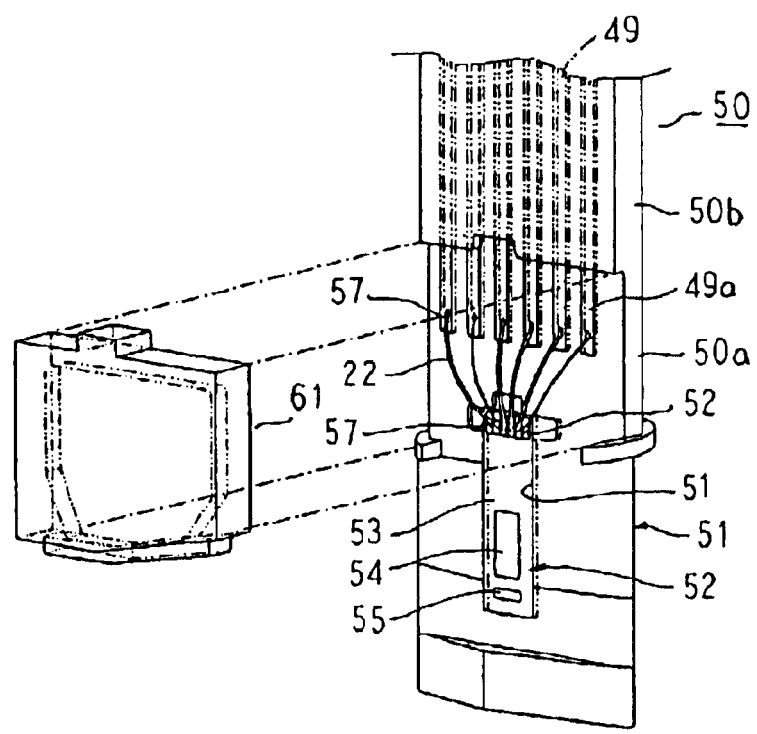
FIG. 9 is an enlarged partial perspective explaining a method for mounting a covering member to the electrical connection portion of the flow rate detecting element in the flow rate sensor according to Embodiment 4 of the present invention.
Figure 10:
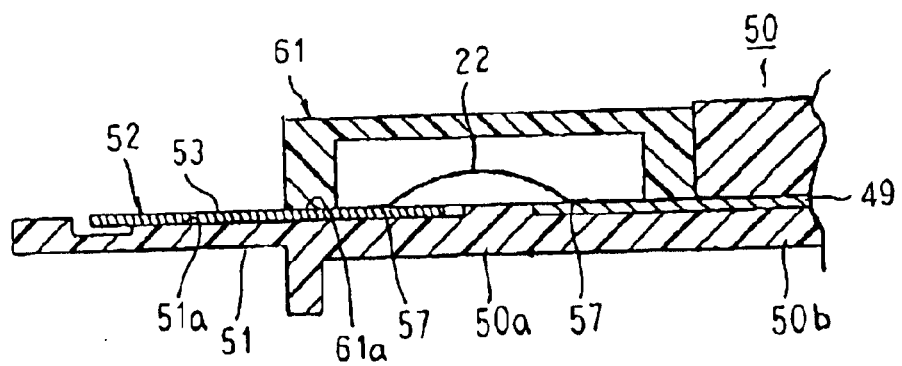
FIG. 10 is a partial cross section showing a vicinity of the electrical connection portion of the flow rate detecting element in the flow rate sensor according to Embodiment 4 of the present invention.

FIG. 8 is an enlarged partial perspective showing an electrical connection portion of a flow rate detecting element in a flow rate sensor according to Embodiment 4 of the present invention, FIG. 9 is an enlarged partial perspective explaining a method for mounting a covering member to the electrical connection portion of the flow rate detecting element in the flow rate sensor according to Embodiment 4 of the present invention, and FIG. 10 is a partial cross section showing a vicinity of the electrical connection portion of the flow rate detecting element in the flow rate sensor according to Embodiment 4 of the present invention.

In FIGS. 8 to 10, a cap 61 functioning as a covering member composed of a resin molding material such as a polyphenylene sulfide resin, for example, is placed on the holder 50 so as to surround the electrical connection portions 57, the bottom surface 61a of the cap 61 being secured by an adhesive to the major surfaces of the thin portion 50a constituting a portion of the holder 50 and the detector auxiliary portion 51 and the major surface of the flow rate detecting element 52. A region surrounding the electrode terminals 52a of the flow rate detecting element 52, the projecting ends 49a of the terminal conductors 49, and the bonding wires 22 is constructed into an airtight hollow construction.

Moreover, the rest of this embodiment is constructed in a similar manner to Embodiment 1 above.

According to Embodiment 4, there is no structure coming into contact with the front surface of the bonding wires 22 or the electrical connection portions 57. Thus, in cases where a flow rate sensor according to Embodiment 4 is used as an intake air flow rate detecting apparatus in an internal combustion engine, even if thermal shock heat drop occurs due to repeatedly alternating high ambient temperatures and low ambient temperatures, thermal stress does not arise in the electrical connection portions 57. The occurrence of cracking of the electrical connection portions 57, separation of the electrical connection portions 57, breakage of the bonding wires 22, etc., resulting from thermal stress concentrated at the electrical connection portions 57 is suppressed.

When a silicone gel, etc., is injected and cured inside the peripheral wall member 56, bubbles get mixed into the gel if defoaming of the silicone gel is insufficient. These bubbles in the gel expand and contract repeatedly due to changes in the surrounding temperature over time, giving rise to unexpected stress in the bonding wires 22 and the electrical connection portions 57, and there is a danger that breakage of the bonding wires 22 or separation of the electrical connection portions 57 will occur.

According to Embodiment 4, the sealant sealing the bonding wires 22 and the electrical connection portions 57 is eliminated, and therefore unexpected stress such as that described above will not occur.

Even if the flow rate sensor is subjected to a great deal of vibration, there is no structure coming into contact with the bonding wires 22, the cap 61 and the bonding wires 22 vibrate together, and the bonding wires 22 will not vibrate in a vibrational mode that is different from that of the electrical connection portions 57, the flow rate detecting element 52, and the holder 50. Consequently, stress concentrated at the electrical connection portions 57 due to differences in the vibrational modes among the bonding wires 22, the electrical connection portions 57, the flow rate detecting element 52, and the holder 50 is eliminated, suppressing separation from the electrical connection portions 57 and breakage of the bonding wires 22, thereby enabling output anomalies from the flow rate sensor to be prevented.

Embodiment 5

Figure 11:
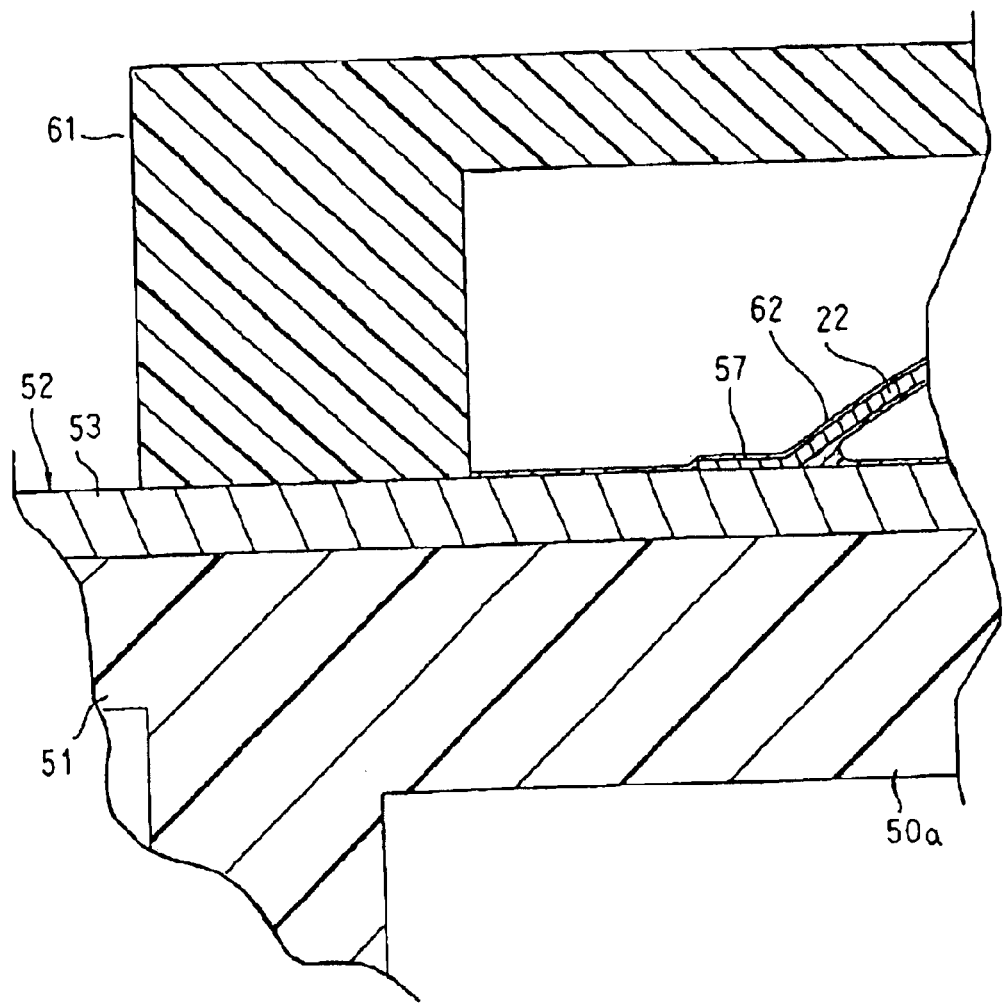
FIG. 11 is a partial enlargement showing a vicinity of an electrical connection portion of a flow rate detecting element in a flow rate sensor according to Embodiment 5 of the present invention.
Figure 14:
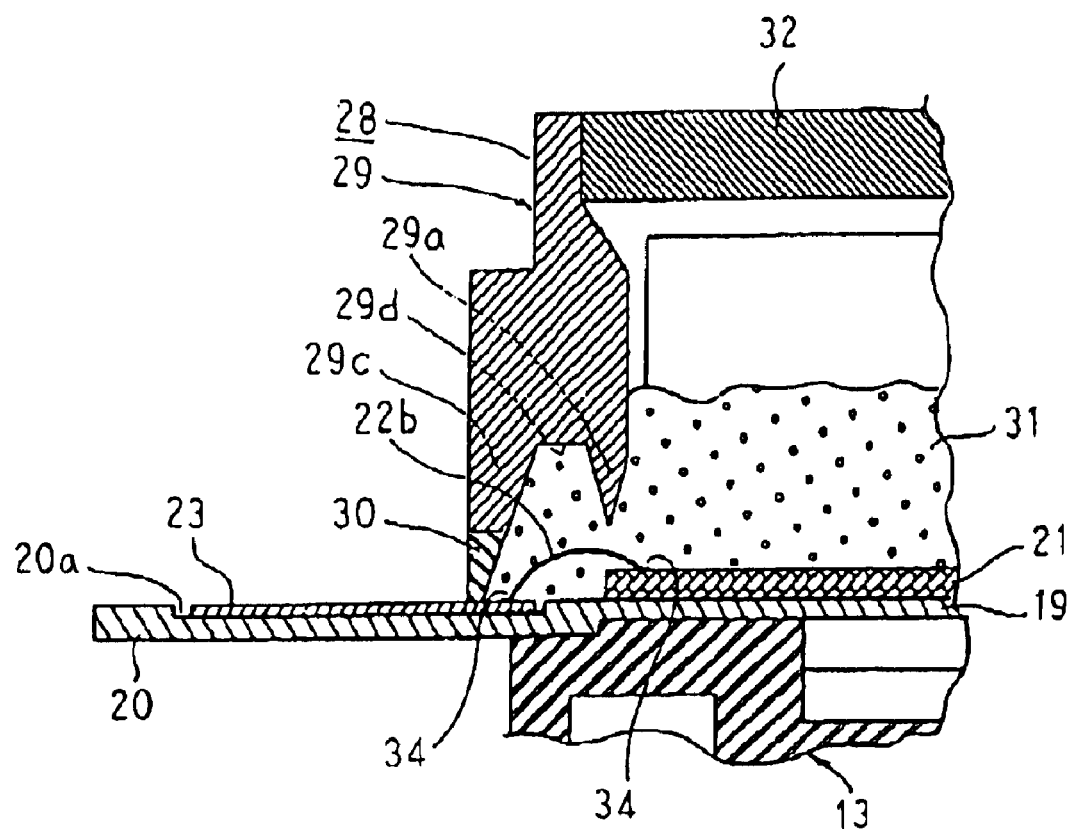
FIG. 14 is an enlarged partial cross section of the conventional flow rate sensor.

In Embodiment 5, as shown in FIG. 11, an electrically-insulating resin coating 62 is coated onto the surface of each of the electrode terminals 52a, each of the projecting ends 49a, each of the electrical connection portions 57, and the bonding wires 22 at a thickness of several $\mu$m to several tens of $\mu$m.

Moreover, the rest of this embodiment is constructed in a similar manner to Embodiment 4 above.

In Embodiment 5, each of the electrode terminals 52a of the flow rate detecting element 52 and each of the projecting ends 49a of the terminal conductors 49 are electrically connected to the bonding wires 22, then, before the process of securing the cap 61 with an adhesive, a Parylene resin (Parylene is a Japanese trademark of Nippon Parylene Kabushiki Kaisha) is coated onto the surface of each of the electrode terminals 52a, each of the projecting ends 49a, each of the electrical connection portions 57, and the bonding wires 22 to form the electrically-insulating resin coating 62 having a thickness of several $\mu$m to several tens of $\mu$m on the surface of each of the electrode terminals 52a, each of the projecting ends 49a, each of the electrical connection portions 57, and the bonding wires 22.

In Embodiment 5, because the electrically-insulating resin coating 62 is formed on the surface of each of the electrode terminals 52a, each of the projecting ends 49a, each of the electrical connection portions 57, and the bonding wires 22, even if condensation occurs inside the cap 61 and water droplets adhere between the bonding wires 22, between the electrode terminals 52a, between the projecting ends 49a, or between the electrical connection portions 57, short-circuiting therebetween can be prevented, eliminating the occurrence of output anomalies from the flow rate sensor.

Here in Embodiment 5, because the electrically-insulating resin coating 62 is formed using a Parylene resin (a poly-para-xylylene resin), the electrically-insulating resin coating 62 can be applied without pin holes forming, enabling incidents of short-circuiting resulting from water droplet adhesion to be reliably prevented.

The electrically-insulating resin coating 62 is not limited to a Parylene resin provided that it is a resin material having electrically-insulating properties and, for example, a polyimide resin can be used.

Moreover, in each of the above embodiments, the flow rate detection resistor 54 and the temperature-compensating resistor 55 are formed in combination on the silicon substrate 53 of the flow rate detecting element 52. In this case, a heat insulation means (not shown) is applied to the silicon substrate 53 so that heat from the flow rate detection resistor 54 is not transferred to the temperature-compensating resistor 55.

In each of the above embodiments, the temperature-compensating resistor 55 does not necessarily have to be formed on the silicon substrate 53; the flow rate detection resistor 54 may be formed on the silicon substrate 53 alone.

In each of the above embodiments, the substrate on which the flow rate detection resistor 54 and the temperature-compensating resistor 55 are formed is not limited to the silicon substrate 53; any electrical insulator such as a ceramic, etc., can be used.

In each of the above embodiments, the material constituting the flow rate detection resistor 54 and the temperature-compensating resistor 55 is not limited to platinum; nickel or a nickel-iron alloy (such as permalloy, trademark of the Western Electric Company) can be used, for example.

Finally, in each of the above embodiments, the flow rate sensor 43 is constituted by a separate member from the main passage 40, but the flow rate sensor 43 and the main passage 40 may be constructed integrally.

What is claimed is:

1. A flow rate sensor comprising:
   a stanchion portion in which terminal conductors are embedded;
   a flow rate detecting element for detecting a flow rate of a fluid being measured, said flow rate detecting element being disposed at a first end of said stanchion portion;
   connecting conductors for electrically connecting electrode terminals of said flow rate detecting element and end portions of said terminal conductors exposed from said stanchion portion, respectively; and
   an electronic circuit portion for controlling an electric current flowing to said flow rate detecting element, said electronic circuit portion being electrically connected to said flow rate detecting element by means of said terminal conductors and said connecting conductors,
   said flow rate sensor having a plug-in construction in which the first end of said stanchion portion is inserted into an aperture opening onto a main passage through which said fluid being measured flows so as to extend into said main passage to detect said flow rate of said fluid being measured,
   wherein electrical connection portions between said electrode terminals of said flow rate detecting element and said connecting conductors and between said end portions of said terminal conductors and said connecting conductors are sealed by a first sealant, and said first sealant is sealed by a second sealant, said second sealant having a physical property of higher hardness than said first sealant.

2. The flow rate sensor according to claim 1, wherein:
   said first sealant has a gel-like physical property, and said second sealant has a rubber-like physical property.

3. The flow rate sensor according to claim 1, wherein:
   said first sealant has a gel-like physical property, and said second sealant is a plastomer.

4. A flow rate sensor comprising:
   a stanchion portion in which terminal conductors are embedded;
   a flow rate detecting element for detecting a flow rate of a fluid being measured, said flow rate detecting element being disposed at a first end of said stanchion portion;
   connecting conductors for electrically connecting electrode terminals of said flow rate detecting element and end portions of said terminal conductors exposed from said stanchion portion, respectively; and
   an electronic circuit portion for controlling an electric current flowing to said flow rate detecting element, said electronic circuit portion being electrically connected to said flow rate detecting element by means of said terminal conductors and said connecting conductors,
   said flow rate sensor having a plug-in construction in which the first end of said stanchion portion is inserted into an aperture opening onto a main passage through which said fluid being measured flows so as to extend into said main passage to detect said flow rate of said fluid being measured,
   wherein a covering member is airtightly mounted to said stanchion portion and said flow rate detecting element so as to envelop said electrode terminals of said flow rate detecting element, said end portions of said terminal conductors, and said connecting conductors, a portion of said flow rate sensor enveloped by said covering member constituting a hollow cavity.

5. The flow rate sensor according to claim 4, wherein:
   an electrically-insulating resin coating is coated to a substantially uniform thickness on surfaces of said electrode terminals of said flow rate detecting element, said end portions of said terminal conductors, and said connecting conductors.

* * * * *